(12) United States Patent
Heiling et al.

(10) Patent No.: US 10,615,617 B2
(45) Date of Patent: Apr. 7, 2020

(54) SUPPLY VOLTAGE SELECTION CIRCUITRY

(71) Applicant: Infineon Technologies AG, Neubiberg (DE)

(72) Inventors: Christian Heiling, Graz (AT); Matthias Bogus, Munich (DE); Benno Koeppl, Markt Indersdorf (DE)

(73) Assignee: Infineon Technologies AG, Neubiberg (DE)

( * ) Notice: Subject to any disclaimer, the term of this patent is extended or adjusted under 35 U.S.C. 154(b) by 363 days.

(21) Appl. No.: 15/426,768

(22) Filed: Feb. 7, 2017

(65) Prior Publication Data

US 2018/0226817 A1   Aug. 9, 2018

(51) Int. Cl.
    *H02J 7/00*  (2006.01)
    *G05F 1/59*  (2006.01)
    *H02P 27/06*  (2006.01)

(52) U.S. Cl.
    CPC .......... *H02J 7/0034* (2013.01); *H02J 7/0063* (2013.01); *G05F 1/59* (2013.01); *H02J 2007/0067* (2013.01); *H02J 2207/20* (2020.01); *H02P 27/06* (2013.01); *H02P 2201/09* (2013.01); *H03K 2217/0027* (2013.01); *H03K 2217/0063* (2013.01); *H03K 2217/0072* (2013.01); *H03K 2217/0081* (2013.01)

(58) Field of Classification Search
    USPC .................................................. 320/126–136
    See application file for complete search history.

(56) References Cited

U.S. PATENT DOCUMENTS

| 2005/0047181 | A1 | 3/2005 | Yamamoto et al. |
| 2013/0249479 | A1* | 9/2013 | Partovi ............ H02J 7/025 320/108 |
| 2014/0091622 | A1* | 4/2014 | Lucas ............. H02J 3/32 307/19 |
| 2016/0056640 | A1* | 2/2016 | Mao ............ H02J 50/12 307/104 |
| 2016/0065072 | A1 | 3/2016 | Xiu et al. |

OTHER PUBLICATIONS

"DRV3201-Q1 3 Phase Motor Driver-IC for Automotive Safety Applications," Texas Instruments Incorporated, DRV3201-Q1 Datasheet, Aug. 2015, 60 pages.

Office Action, in the German language, from counterpart German Application No. 102018102342.1, dated Nov. 12, 2019, 8 pp.

* cited by examiner

*Primary Examiner* — Binh C Tat

(74) *Attorney, Agent, or Firm* — Shumaker & Sieffert, P.A.

(57) ABSTRACT

Supply voltage switching circuitry that is configured to dynamically switch between a battery supply voltage and a boost supply voltage, that is generated from the battery supply voltage, to power half-bridge driver circuitry based on an on-going evaluation of one or more system parameters. The supply voltage switching circuitry is configured to deliver the boost supply voltage to high-side driver circuitry. The supply voltage switching circuitry is configured to select between delivering the boost supply voltage to low-side driver circuitry and delivering the battery supply voltage to low-side driver circuitry.

9 Claims, 12 Drawing Sheets

SUPPLY VOLTAGE SELECTION CIRCUITRY

TECHNICAL FIELD

The present disclosure relates to driver integrated circuits (ICs) used to drive MOSFET (Metal-Oxide-Semiconductor Field-Effect Transistor) devices.

BACKGROUND

In a wide range of power applications, driver ICs may be used to drive remote standard MOSFET devices arranged in a half-bridge topology. More specifically, the driver ICs may be used for tasks such as driving, supervising and protecting the MOSFETs from external faults and hence from destruction due to short-circuit or over-temperature situations. In some examples, such driver ICs may comprise two-stage charge-pumps in order to provide an appropriate supply voltage for high-side drivers. In order to allow for low-voltage operation with respect to supply voltage, the first stage of the two-stage charge-pump may be used to supply low-side drivers. By doing so, a driver IC may typically operate a MOSFET with supply voltages down to approximately 6 V. However, there is an increasing demand for driver ICs capable of operating during low-voltage supply voltage conditions, such as down to 4.5 V for example. Thus, one disadvantage or limitation of the two-stage charge pump implementation relates to achievable functional operating range with respect to supply voltage, whereby the two-stage charge pump implementation may not be a viable solution to satisfy operational requirements with respect to low-voltage supply voltage conditions. Another disadvantage or limitation of the two-stage charge pump implementation relates to excessive power dissipation. Since supply voltage for low-side drivers is usually taken from the output of the first charge-pump stage, power dissipation is very high when the supply voltage is high because the output voltage of the low-side driver must be limited to approximately 10 V. The features or aspects of the present disclosure address these and other issues associated with typical or conventional driver IC supply voltage topologies.

SUMMARY

The present disclosure is directed to supply voltage selection circuitry. In some examples, the supply voltage selection circuitry is configured to dynamically switch between a battery supply voltage and a boost supply voltage, which is generated from the battery supply voltage, to power half-bridge driver circuitry based on an on-going evaluation of one or more system parameters. Aspects of the present disclosure are relevant to any application in which it is desirable to observe thermal limits of an integrated circuit package without limiting the functional operating range of the integrated circuit package.

As an example, a circuit includes or comprises: supply voltage selection circuitry configured to provide a supply voltage to gate driver circuitry; wherein the supply voltage selection circuitry is further configured to select between a first supply voltage and a second supply voltage that is greater in magnitude than the first supply voltage; and wherein the supply voltage selection circuitry is further configured to deliver the first supply voltage to the gate driver circuitry on condition that the first supply voltage is in magnitude greater than or equal to a threshold voltage value and to deliver the second supply voltage to the gate driver circuitry on condition that the first supply voltage is in magnitude less than the threshold voltage value.

As another example, a method includes or comprises: monitoring a battery supply voltage; based on a magnitude of the battery supply voltage, selecting one of the battery supply voltage and a boost supply voltage that is generated from the battery supply voltage as supply voltage for gate driver circuitry; and delivering the battery supply voltage to the gate driver circuitry on condition that the battery supply voltage is in magnitude greater than or equal to a threshold voltage value or the boost supply voltage to the gate driver circuitry on condition that the battery supply voltage is in magnitude less than the threshold voltage value.

As another example, a half-bridge driver integrated circuit (IC) includes or comprises: low-side half-bridge gate driver circuitry; and processor circuitry configured to: monitor a battery supply voltage; and based on a magnitude of the battery supply voltage, select one of the battery supply voltage and a boost supply voltage that is generated from the battery supply voltage as supply voltage for the low-side half-bridge gate driver circuitry.

DETAILED DESCRIPTION

The present disclosure is directed to supply voltage selection circuitry. In some examples, the supply voltage selection circuitry is configured to dynamically switch between a battery supply voltage and a boost supply voltage, which is generated from the battery supply voltage, to power half-bridge driver circuitry based on an on-going evaluation of one or more system parameters. By dynamically switching between battery supply voltage and boost supply voltage in a manner as contemplated, thermal limits of an integrated circuit (IC) package that includes half-bridge driver circuitry may be observed without limiting the functional operating range of the IC package. Although not so limited, an appreciation of the various aspects of the present disclosure may be gained from the following discussion provided in connection with the drawings.

Figure 1:
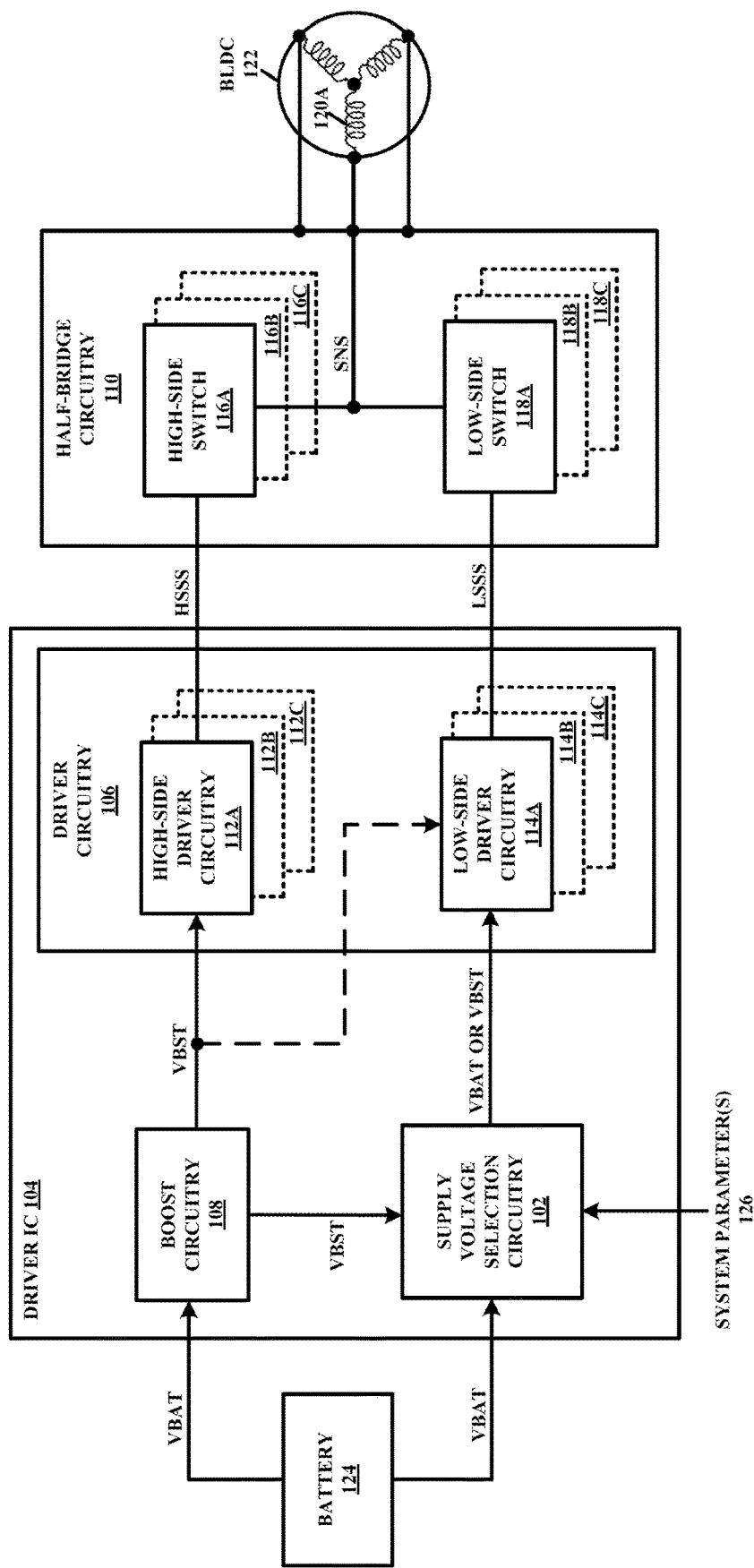
FIG. 1 shows a schematic block diagram of a system that includes supply voltage selection circuitry incorporated within an integrated circuit package in accordance with the present disclosure.

For example, FIG. 1 shows a schematic block diagram of a system 100 that includes supply voltage selection circuitry (SVSC) 102 incorporated within IC package 104, equivalently driver IC 104, in accordance with the present disclosure. More specifically, SVSC 102, driver circuitry 106 and boost circuitry 108 are incorporated within driver IC 104, and driver IC 104 is in general configured to drive half-bridge circuitry 110 as shown in FIG. 1. An example of such a driver IC corresponds to any one product from the TLEx family of products by Infineon Technologies of Neubiberg, Germany, used for automotive applications such as power steering, HVAC compressors and engine cooling fans. However, aspects of the present disclosure are relevant to any application in which it is desirable to observe thermal limits of an IC package without limiting the functional operating range of the IC package.

As mentioned, driver IC 104 is configured to drive half-bridge circuitry 110 as shown in FIG. 1. Specifically, high-side driver circuitry (HSDC) 112A-C (collectively, "HSDC 112") and low-side driver circuitry (LSDC) 114A-C (collectively, "LSDC 114") of driver circuitry 106 may be configured to switch ON/OFF a corresponding one of high-side switch (HSS) 116A-C (collectively, "HSS 116") and low-side switch (LSS) 118A-C (collectively, "LSS 118") of half-bridge circuitry 110 via appropriate timing of a corresponding high-side switch signal (HSSS) and a low-side switch signal (LSSS), such that a corresponding switch node signal (SNS) is developed to drive a corresponding winding 120A-C of brushless DC motor 122. In a typical implementation, due to the topology of half-bridge circuitry 110 (see e.g., FIG. 4), a boost supply voltage (VBST) that is generated by boost circuitry 108, from a battery supply voltage (VBAT) output by battery 124 as shown in FIG. 1, is used to power HSDC 112 as well as LSDC 114 (illustrated by intermittent line in FIG. 1) to insure that HSSS and LSSS are each of sufficient magnitude to effectively switch high-side switch 116 and low-side switch 118.

The typical implementation, however, can be inefficient because at relatively high VBAT voltages, and by consequence relatively high VBST voltages, power is dissipated by LSDC 114, and by consequence heat is generated, at a level that is unnecessary and overly excessive. Additionally, the typical implementation precludes driver IC 104 from being realized as an IC package of arbitrary size or dimension without potentially limiting the functional operating range of driver IC 104. To overcome these and other issues, SVSC 102 as shown in FIG. 1 is configured to dynamically switch between VBAT and VBST to power LSDC 114, while VBST is used to power HSDC 112, based on an on-going evaluation of one or more system parameters 126. The advantageous result of dynamically switching between VBAT and VBST in a manner as contemplated is illustrated in FIG. 2.

Figure 2:
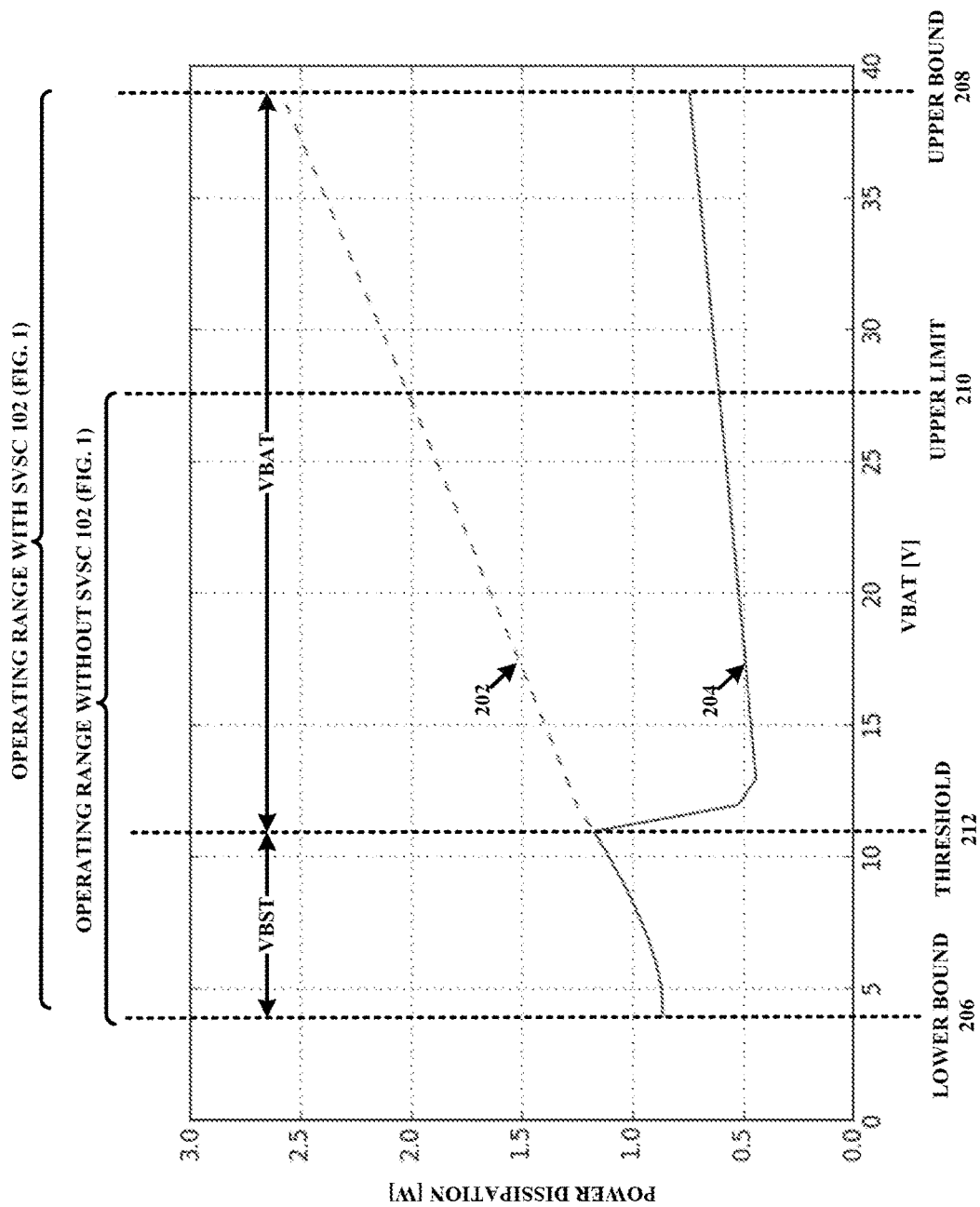
FIG. 2 shows a plot of power dissipation of the integrated circuit package of FIG. 1.

FIG. 2 shows a plot 200 of power dissipation by driver IC 104 of FIG. 1. In particular, trace 202 illustrates power dissipation by driver IC 104 without SVSC 102 to dynamically switch between VBAT and VBST to power LSDC 114, and trace 204 illustrates power dissipation by driver IC 104 with SVSC 102 to dynamically switch between VBAT and VBST to power LSDC 114. In this example, the intended functional operating range of driver IC 104, or the range of voltage values for VBAT as output by battery 124 over which driver IC 104 is intended to operate, is defined between lower bound value 206 (e.g., about 4 V) and upper bound value 208 (e.g., about 39 V) as shown in FIG. 2.

With reference to trace 202, in an example whereby driver IC 104 is realized as an IC package that is capable of dissipating a maximum of 2.0 W, the permissible functional operating range of driver IC 104, or the range of voltage values for VBAT as output by battery 124 over which driver IC 104 is permissible to operate, is defined between lower bound value 206 and upper limit value 210 (e.g., about 27.5 V) as shown in FIG. 2. This is because overheating and failure of driver IC 104 may occur if during operation driver IC 104 exceeds 2.0 W of power dissipation. Thus, in this example, without SVSC 102 to dynamically switch between VBAT and VB ST to power LSDC 114, thermal limits of driver IC 104 may only be observed by limiting the functional operating range of driver IC 104 to the permissible functional operating range as described.

With reference to trace 204, with SVSC 102 to dynamically switch between VBAT and VB ST to power LSDC 114, thermal limits of driver IC 104 may be observed without limiting the functional operating range of driver IC 104 to the permissible functional operating range as described. This is because power dissipation of driver IC 104 is less than 2.0 W over the entire intended functional operating range of driver IC 104. In practice, SVSC 102 is configured to dynamically switch between VBAT and VBST to power LSDC 114 at a threshold voltage value (VTH) 212 that has a value (e.g., about 11 V) selected based upon an on-going evaluation of one or more system parameters 126 (see FIG. 1), to maintain power dissipation of driver IC 104 to less than the maximum allowed over the entire intended functional operating range of driver IC 104.

More specifically, while VTH 212 is discussed in detail below in connection with FIG. 3 and FIG. 8, SVSC 102 is configured to switch from VBST to VBAT to power LSDC 114 as VBAT increases from a voltage value less than VTH 212 to a voltage value greater than (or equal to) VTH 212 during operation of driver IC 104. At voltages of VBAT greater than VTH 212, and without SVSC 102 to dynamically switch between VBAT and VBST to power LSDC 114, power is dissipated by LSDC 114 and by extension driver IC 104 at a level that is unnecessary and overly excessive. This is illustrated in FIG. 2 by comparison of trace 202 and trace 204 for voltages of VBAT greater than VTH 212, whereby the approximate linearity of each one of trace 202 and trace 204 is due to the power dissipation contribution of LSDC 114. As discussed below, the power dissipation contribution of LSDC 114 dominates over the power dissipation contribution of booster circuitry 108 at voltages of VBAT greater than VTH 212.

Conversely, SVSC 102 is configured to switch from VBAT to VBST to power LSDC 114 as VBAT decreases from a voltage value greater than VTH 212 to a voltage value less than VTH 212 during operation of driver IC 104. In general, VBST is used to power LSDC 114 at voltages of VBAT less than VTH 212 to insure that LSSS is of sufficient magnitude to effectively switch LSS 118. Such an implementation advantageously insures proper low voltage (supply voltage) operation of driver IC 104. Further, the non-linearity of each one of trace 202 and trace 204 at voltages of VBAT less than VTH 212 is due to the power dissipation contribution of booster circuitry 108, which dominates over the power dissipation contribution of LSDC 114 because booster circuitry 108 is loaded by both HSDC 112 and LSDC 114 at voltages of VBAT less than VTH 212.

By contrast, booster circuitry 108 is loaded only by HSDC 112 at voltages of VBAT greater than VTH 212. In this way, as illustrated by comparison of trace 202 and trace 204 in FIG. 2, power dissipation of driver IC 104 at voltages of VBAT greater than VTH 212 is substantially, or to a great or significant extent, reduced (see trace 204) at voltages of VBAT greater than VTH 212 with SVSC 102 to dynamically switch between VBAT and VBST to power LSDC 114A. Similarly, because booster circuitry 108 is loaded only by HSDC 112 at voltages of VBAT greater than VTH 212, the rate at which power dissipation of driver IC 104 increases with increasing VBAT is substantially, or to a great or significant extent, reduced as illustrated by comparison of the slope of trace 202 and the slope of trace 204 in FIG. 2 at voltages of VBAT greater than VTH 212.

Thus, with SVSC 102 to dynamically switch between VBAT and VBST to power LSDC 114, the inefficiency and IC package-size-related issues associated with the typical implementation as mentioned above are simultaneously overcome. Specifically, efficiency of driver IC 104 is increased as compared to the typical implementation because power is not dissipated at voltages of VBAT greater than VTH 212 at a level that is unnecessary and overly excessive, as illustrated in FIG. 2. Additionally, it is contemplated that driver IC 104 may be realized as an IC package of arbitrary size or dimension without potentially limiting the functional operating range of driver IC 104. This is because power dissipation of driver IC 104 over the entire intended functional operating range of driver IC 104 may be limited to levels less than or equal to that at voltages of VBAT less than VTH 212, as illustrated in FIG. 2. The regime of operation at voltages of VBAT less than VTH 212 corresponds to low-voltage (supply voltage) operation of driver IC 104, and magnitude of power dissipation in this regime as shown in FIG. 2 (i.e., <1.5 W) are typically acceptable for most package types.

For example, magnitude of power dissipation at voltages of VBAT less than VTH 212 as shown in FIG. 2, and by extension magnitude of power dissipation at voltages of VBAT greater than VTH 212, is acceptable for a TLEx driver IC realized as a PG-VQFN-48 package type, provided by Infineon Technologies of Neubiberg, Germany, which has a maximum allowable power dissipation of about 2.0 W. Thus, if driver IC 104 was realized as a PG-VQFN-48 package type, then thermal limits of driver IC 104 may be observed without limiting the functional operating range of driver IC 104.

As mentioned above, in some examples, SVSC 102 is configured to dynamically switch between VBAT and VBST to power LSDC 114 at VTH 212 that has a value selected based upon an on-going evaluation of one or more system parameters 126, to maintain power dissipation of driver IC 104 to less than the maximum allowed over the entire intended functional operating range of driver IC 104. FIG. 3 shows a schematic block diagram of SVSC 102 of FIG. 1, in an example implementation. In this example, processor circuitry 302 of SVSC 102 is configured to receive as input one or more system parameters 126, and to implement an algorithm to dynamically determine, on an on-going basis such as continuously, periodically or at least intermittently in time, a value for VTH 212 based on an evaluation of system parameter(s) 126. While such an algorithm is discussed below in connection with FIG. 8, controller circuitry 304 is configured to receive as input VBAT as well as the value for VTH 212 as determined by processor circuitry 302. Upon VBAT reaching VTH 212 in any manner as discussed above in connection with FIG. 2, controller circuitry 304 is configured to generate a signal 308 to control switch circuitry 306 to route or deliver one of VBAT and VBST to LSDC 114. A more detailed example of such an implementation is illustrated in FIG. 4, whereby processor circuitry 302 and controller circuitry 304 are collectively embodied as control circuitry 305.

Figure 3:
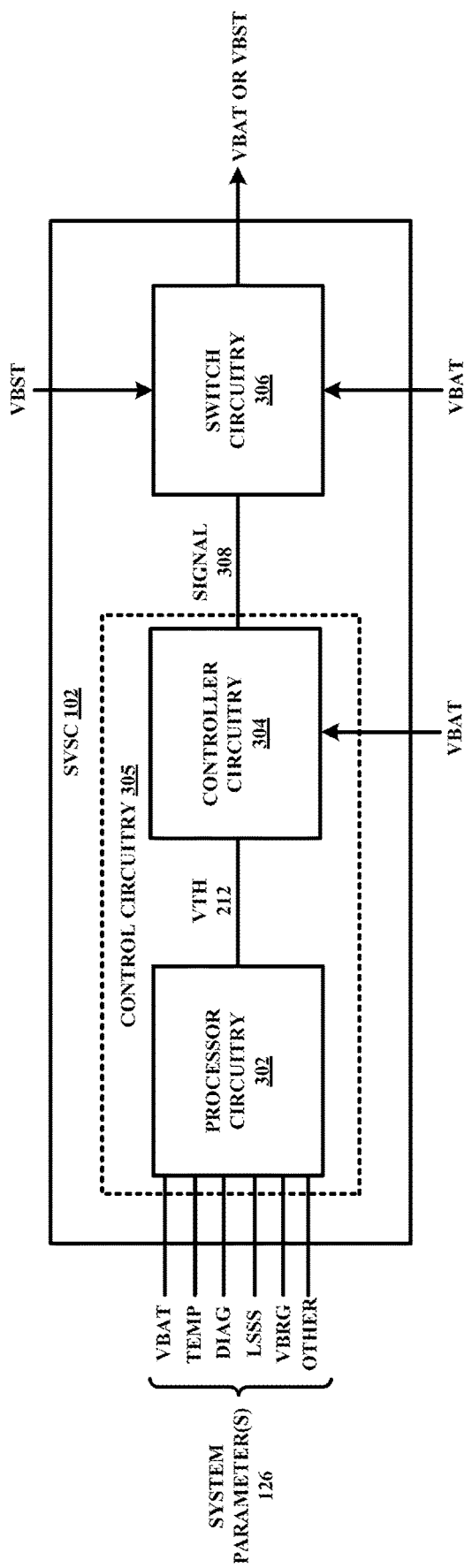
FIG. 3 shows a schematic block diagram of the supply voltage selection circuitry of FIG. 1, in an example implementation.
Figure 4:
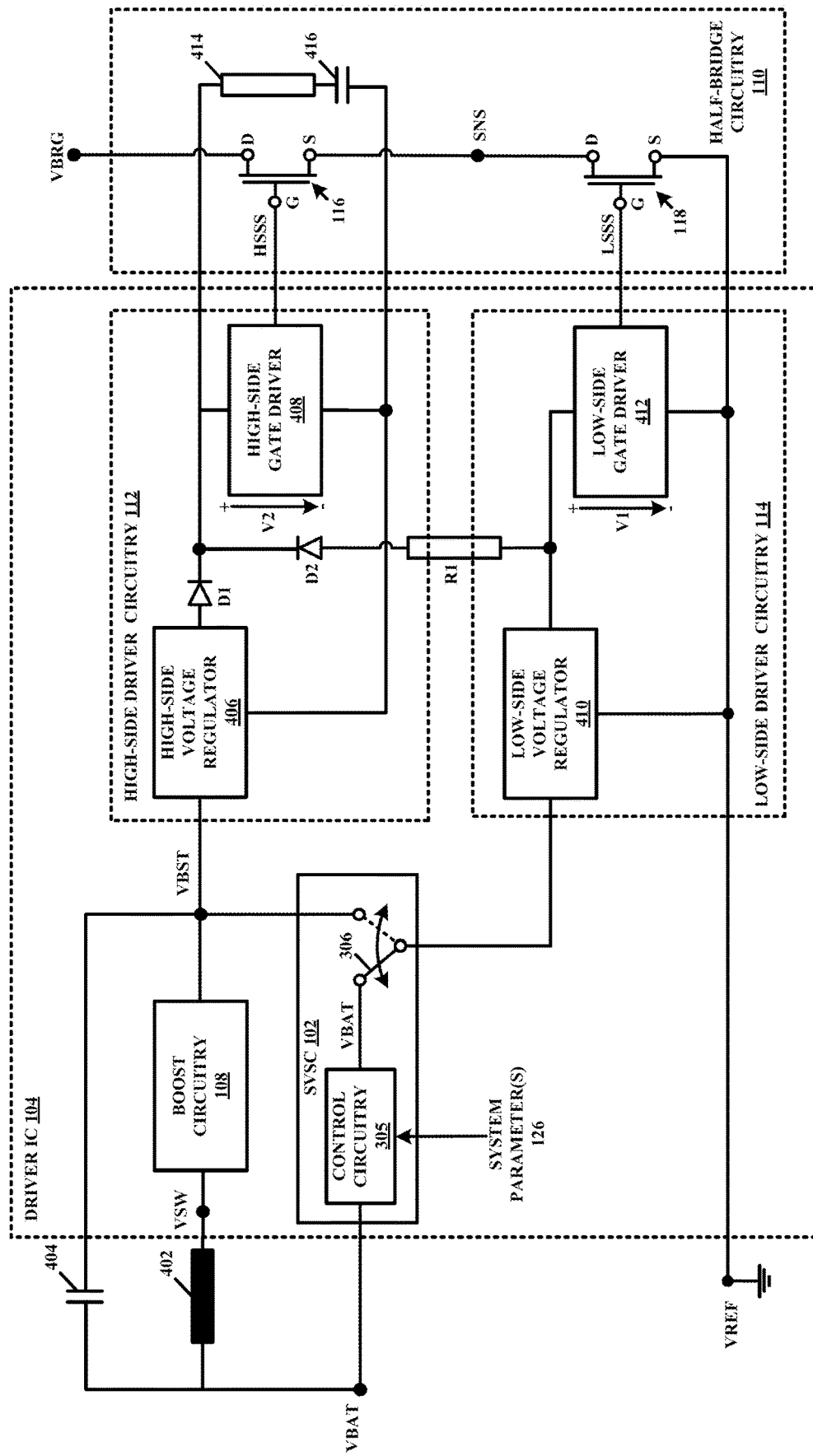
FIG. 4 shows a hybrid schematic block and circuit diagram of aspects of FIG. 1 and FIG. 3, in an example implementation.

FIG. 4 shows a hybrid schematic block and circuit diagram of aspects of FIG. 1 and FIG. 3, in an example implementation, where like parts are identified by like reference numbers throughout. In this example, however, boost inductor 402 and capacitor 404 are coupled to boost circuitry 108 to enable boost circuitry 108 to generate VBST from VBAT. Additionally, HSDC 112 is configured to include high-side voltage regulator 406 and high-side gate driver 408, and LSDC 114 is configured to include low-side voltage regulator 410 and low-side gate driver 412. Additionally, half-bridge circuitry 110 is configured to include bootstrap resistor 414 and capacitor 416, to provide power to high-side gate driver 408.

In operation, processor circuitry 302 together with controller circuitry 304 of SVSC 102 may be configured to control state of switch circuitry 306 (opened/closed with respect to VBST/VBAT) to switch from VBST to VBAT, which is regulated via low-side voltage regulator 410, to power low-side gate driver 412 as VBAT increases from a voltage value less than VTH 212 to a voltage value greater than (or equal to) VTH 212 during operation of driver IC 104. This is consistent with the description provided above in connection with FIG. 2, whereby at voltages of VBAT greater than VTH 212, and without SVSC 102 to dynamically switch between VBAT and VBST to power low-side gate driver 412, power is dissipated by low-side voltage regulator 410 and by extension driver IC 104 at a level that is unnecessary and overly excessive. This is mainly due to rising drop-out voltage of low-side voltage regulator 410 at fixed output current.

Conversely, processor circuitry 302 together with controller circuitry 304 of SVSC 102 may be configured to control state of switch circuitry 306 (opened/closed with respect to VBST/VBAT) to switch from VBAT to VBST, which is regulated via low-side voltage regulator 410, to power low-side gate driver 412 as VBAT decreases from a voltage value greater than VTH 212 to a voltage value less than (or equal to) VTH 212 during operation of driver IC 104. This is consistent with the description provided above in connection with FIG. 2, whereby VBST is used to power low-side gate driver 412 at voltages of VBAT less than VTH 212 to insure that LSSS is of sufficient magnitude to effectively switch low-side switch 118 (i.e., $V_{GS}$ of low-side switch 118 is of sufficient magnitude), which occurs when voltage drop V1 across low-side gate driver 412 as shown in FIG. 4 is of sufficient magnitude such that low-side gate driver 412 is not underpowered. With respect to HSDC 112 as shown in FIG. 4, VBST is used to power high-side gate driver 408, where VBST is regulated via high-side voltage regulator 406, at voltages of VBAT over the entire intended functional operating range of driver IC 104 to insure that HSSS is of sufficient magnitude to effectively switch high-side switch 116 (i.e., $V_{GS}$ of high-side switch 116 is of sufficient magnitude), which occurs when voltage drop V2 across high-side gate driver 408 as shown in FIG. 4 is of sufficient magnitude such that high-side gate driver 408 is not underpowered.

Figure 5:
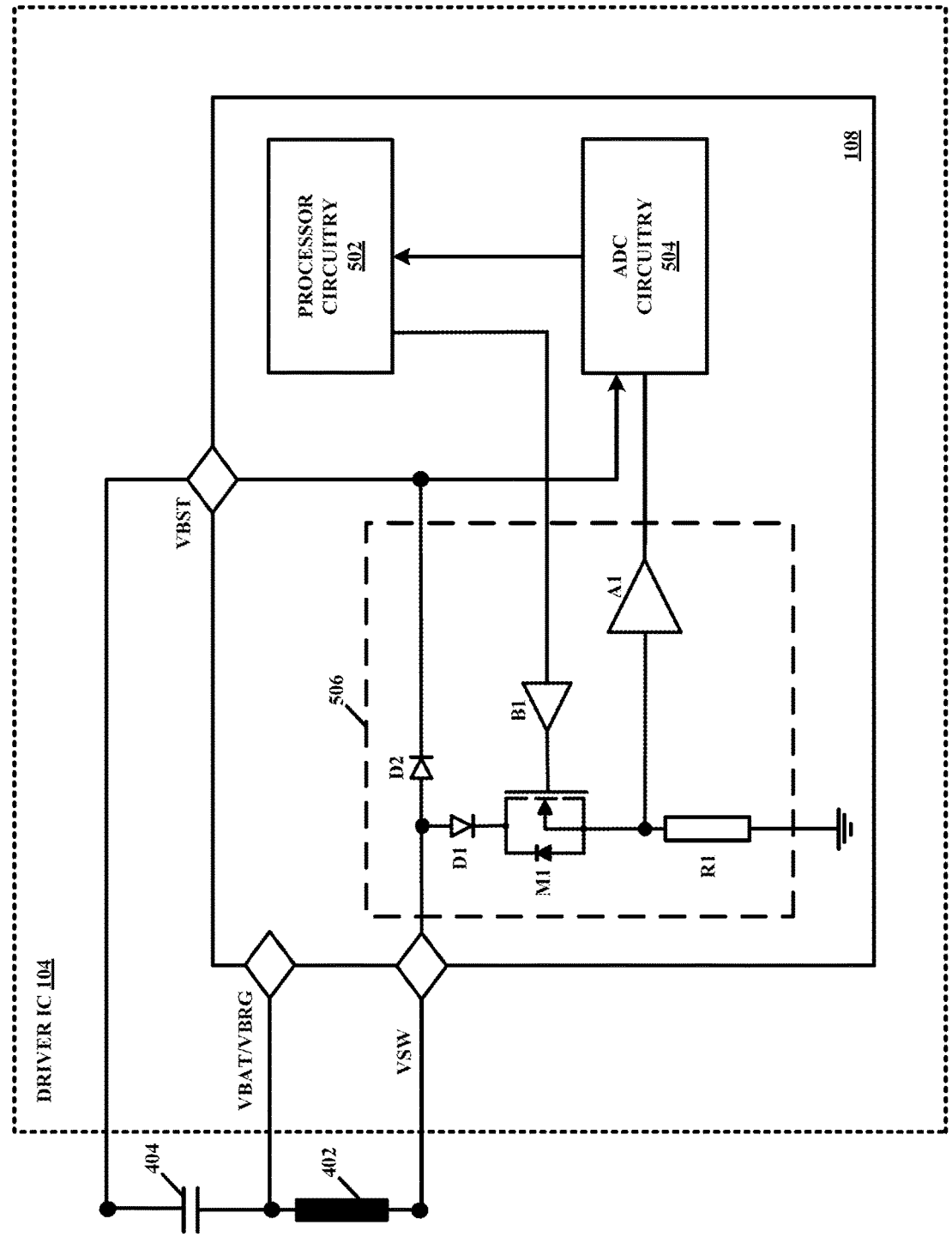
FIG. 5 shows a hybrid schematic block and circuit diagram of first aspects of FIG. 1 and FIG. 4, in an example implementation

FIG. 5 shows a hybrid schematic block and circuit diagram of first aspects of FIG. 1 and FIG. 4, in an example implementation, where like parts are identified by like reference numbers throughout. In this example, boost inductor 402 and capacitor 404 are external to driver IC 104, whereby boost inductor 402 and capacitor 404 are connected at VBAT or positive supply voltage (VBRG) of half-bridge circuitry 110 (see FIG. 4) if determined advantageous. Additionally, the topology of boost circuitry 108 is such that a voltage (and current) regulation loop is defined between processor circuitry 502, ADC circuitry 504 as well as control circuitry 506 to regulate VB ST to a magnitude within specification tolerance, and a current regulation loop is defined to gain current information via shunt resistor R1 and amplifier A1. The phrase "to a magnitude within specification tolerance" is intended to indicate that boost circuitry 108 as illustrated in FIG. 5 is configured and/or arranged to generate VBST, over the entire intended functional operating range of driver IC 104, at a magnitude that only fluctuates slightly about an intended value (e.g., 55 V+/−5 mV, etc.). Such an implementation as shown in FIG. 5 is especially optimized when DC/DC operation frequencies on the order of 1 MHz are required. While illustrated as integrated with boost circuitry 108 in FIG. 5, each one or more of respective components of boost circuitry 108 may be replaced by an external component(s) possibly together with integrated driving circuit(s).

Figure 6:
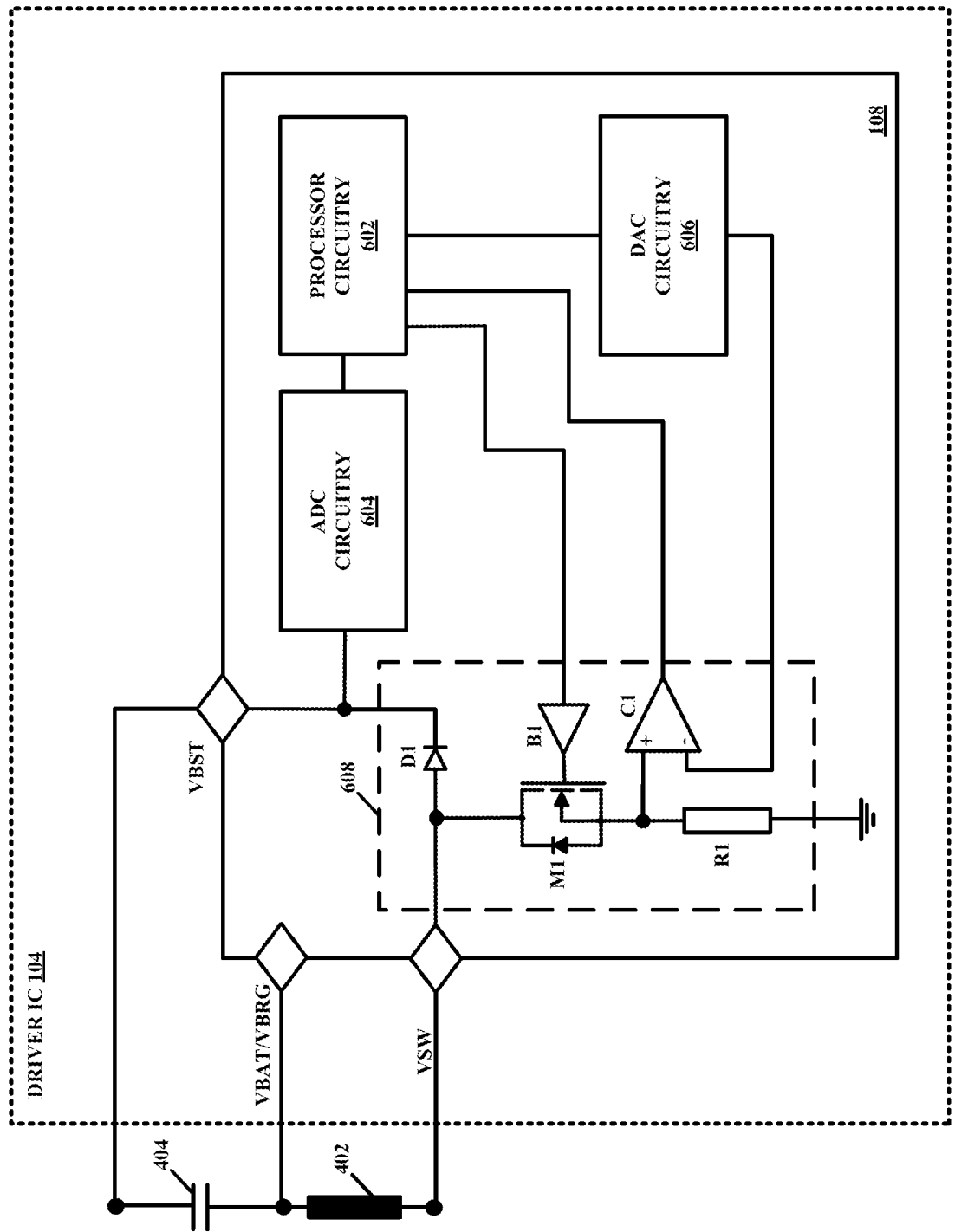
FIG. 6 shows a hybrid schematic block and circuit diagram of second aspects of FIG. 1 and FIG. 4, in an example implementation

FIG. 6 shows a hybrid schematic block and circuit diagram of second aspects of FIG. 1 and FIG. 4, in an example implementation, where like parts are identified by like reference numbers throughout. In this example, boost inductor 402 and capacitor 404 are external to driver IC 104, whereby boost inductor 402 and capacitor 404 are connected at VBAT or positive supply voltage (VBRG) of half-bridge circuitry 110 (see FIG. 4) if determined advantageous. Additionally, boost circuitry 108 is configured to include processor circuitry 602, ADC circuitry 604, digital-analog converter (DAC) circuitry 606 as well as control circuitry 608 that includes diode D1, switch M1, buffer B1, shunt resistor R1 and comparator C1. In the example of FIG. 6, the topology of boost circuitry 108 is such that switch M1 is used to energize inductor 402, and diode D1 is used for signal rectification. Additionally, the topology of boost circuitry 108 is such that a voltage (and current) regulation loop is defined between processor circuitry 602, ADC circuitry 604, as well as control circuitry 608 to regulate VB ST to a magnitude within specification tolerance, and a current regulation loop is defined to gain current information via peak current techniques using DAC circuitry 606 to generate a set-point and comparator C1 to monitor current flowing in inductor 402. The phrase "to a magnitude within specification tolerance" is intended to indicate that boost circuitry 108 as illustrated in FIG. 6 is configured and/or arranged to generate VBST, over the entire intended functional operating range of driver IC 104, at a magnitude that only fluctuates slightly about an intended value (e.g., 40 V+/−1 mV, etc.). Such an implementation as shown in FIG. 6 is especially optimized when DC/DC operation frequencies on the order of 2 MHz are required. While illustrated as integrated with boost circuitry 108 in FIG. 6, each one or more of respective components of boost circuitry 108 may be replaced by an external component(s) possibly together with integrated driving circuit(s).

Figure 7:
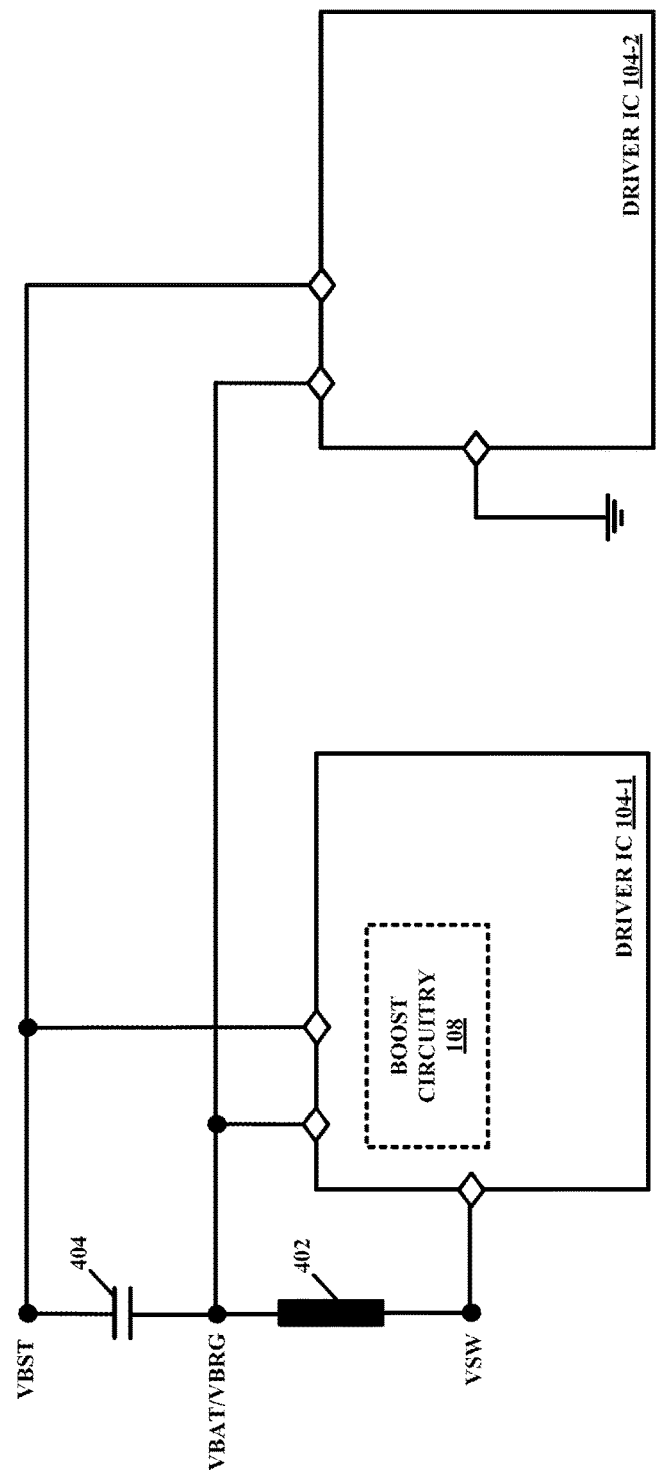
FIG. 7 shows a hybrid schematic block and circuit diagram of aspects of FIG. 1, in an example implementation.

FIG. 7 shows a hybrid schematic block and circuit diagram of aspects of FIG. 1, in an example implementation, where like parts are identified by like reference numbers throughout. In many applications, such as automotive applications, a certain amount of redundancy may be called for to achieve a required availability or safety target. For this reason, in some scenarios, more than a single instance of driver IC 104 as shown in FIG. 1 may be required to drive motor 122, or in other scenarios multiple instances of motor 122 may be required to be driven from, ultimately, VBAT as output by battery 124 of FIG. 1. In these and other scenarios, it may be advantageous to use a single instance of boost circuitry 108 to generate VBST for multiple instances of driver IC 104 for switching between VBAT and VBST to power LSDC 114 in a manner as contemplated throughout. This is shown in FIG. 7, whereby only boost circuitry 108 of driver IC 104-1 (indicated by intermittent line in FIG. 7) is used to generate VBST for switching between VBAT and VBST to power LSDC 114 (see FIG. 1) of both driver IC 104-1 and driver IC 104-2 in a manner as contemplated throughout. Advantageously, in such an arrangement, the number of required external components (such as boost inductor 402 and capacitor 404, each one of which may be relatively expensive) may be reduced to a minimum, while the overall efficiency of system 100 is still optimized, regardless of package type of driver IC 104-1 and driver IC 104-2, as discussed above. Although two instances of driver IC 104 are illustrated in FIG. 7, any number of instances of driver IC may be used.

Figure 8:
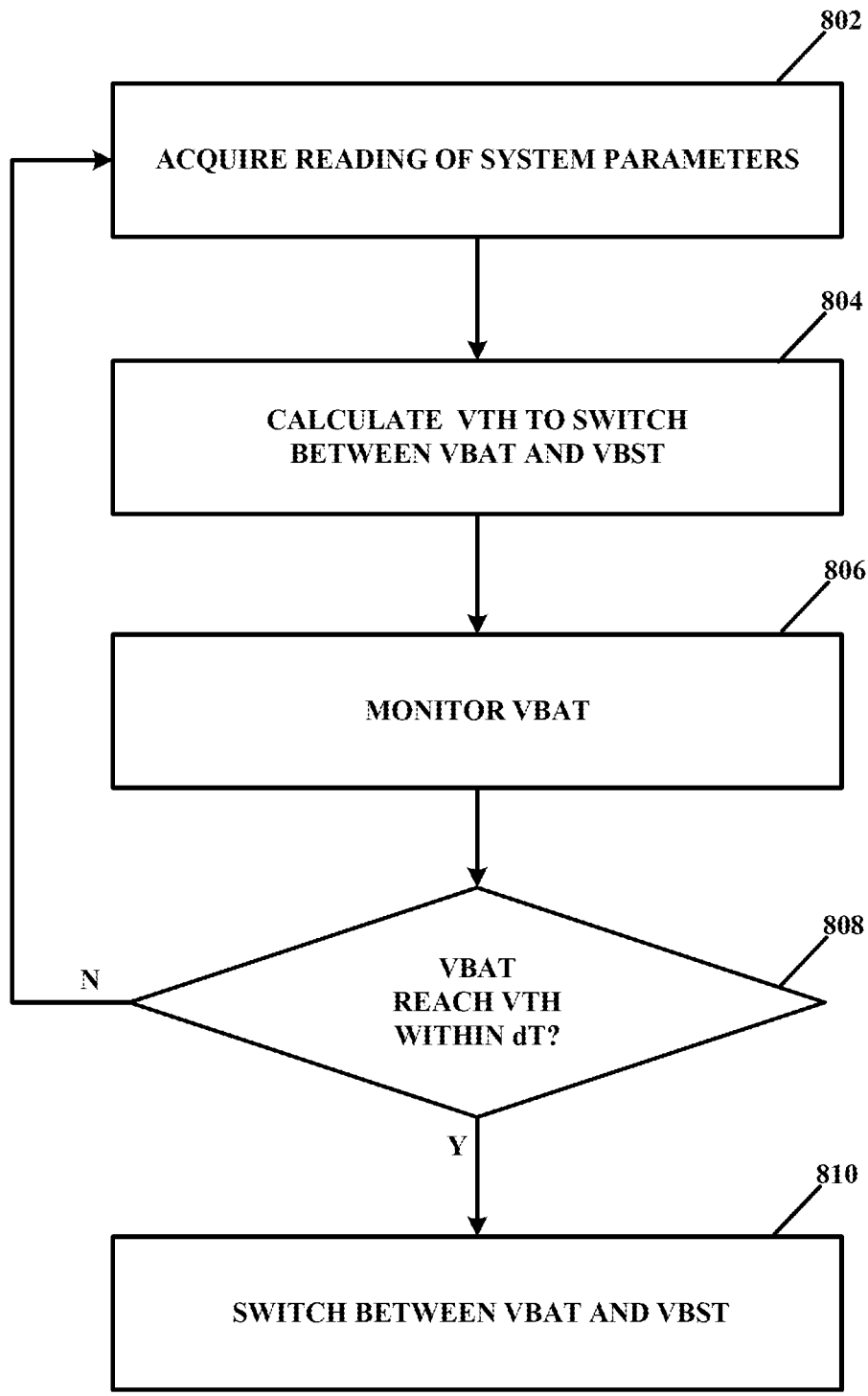
FIG. 8 shows a flowchart of a method for dynamically switching between a battery supply voltage and a boost supply voltage in accordance with the present disclosure.

FIG. 8 shows a flowchart of an example method 800 for dynamically switching between VBAT and VBST in accordance with the present disclosure. With additional reference to FIGS. 1-4, it is contemplated that SVSC 102 is configured to acquire (802) a reading of one or more system parameters 126 and calculate (804) VTH 212 based on the reading of one or more system parameters 126. As an example, at least one of a voltage reading of VBAT may be acquired, a temperature reading TEMP of any particular component of or electrically or mechanically coupled to system 100 may be acquired, a diagnostic reading DIAG of any particular component of or electrically or mechanically coupled to system 100 may be acquired, a voltage reading of LSSS may be acquired, a voltage reading of VBRG may be acquired and/or any other reading OTHER of or associated with any particular component of or electrically or mechanically coupled to system 100 may be acquired and factored-in to a determination of a value for VTH 212. Further, any acquired reading may be manipulated to derive other information that may be factored-in to a determination of a value for VTH 212. For example, mathematical operations such as any of one or more of derivative operations, integral operations and statistical operations may be implemented to derive other information that may be factored-in to a determination of a value for VTH 212. Such an aspect is advantageous because not only instantaneous but time-variable or time-sensitive parameters or metrics may be factored-in to a determination of a value for VTH 212.

Figure 9:
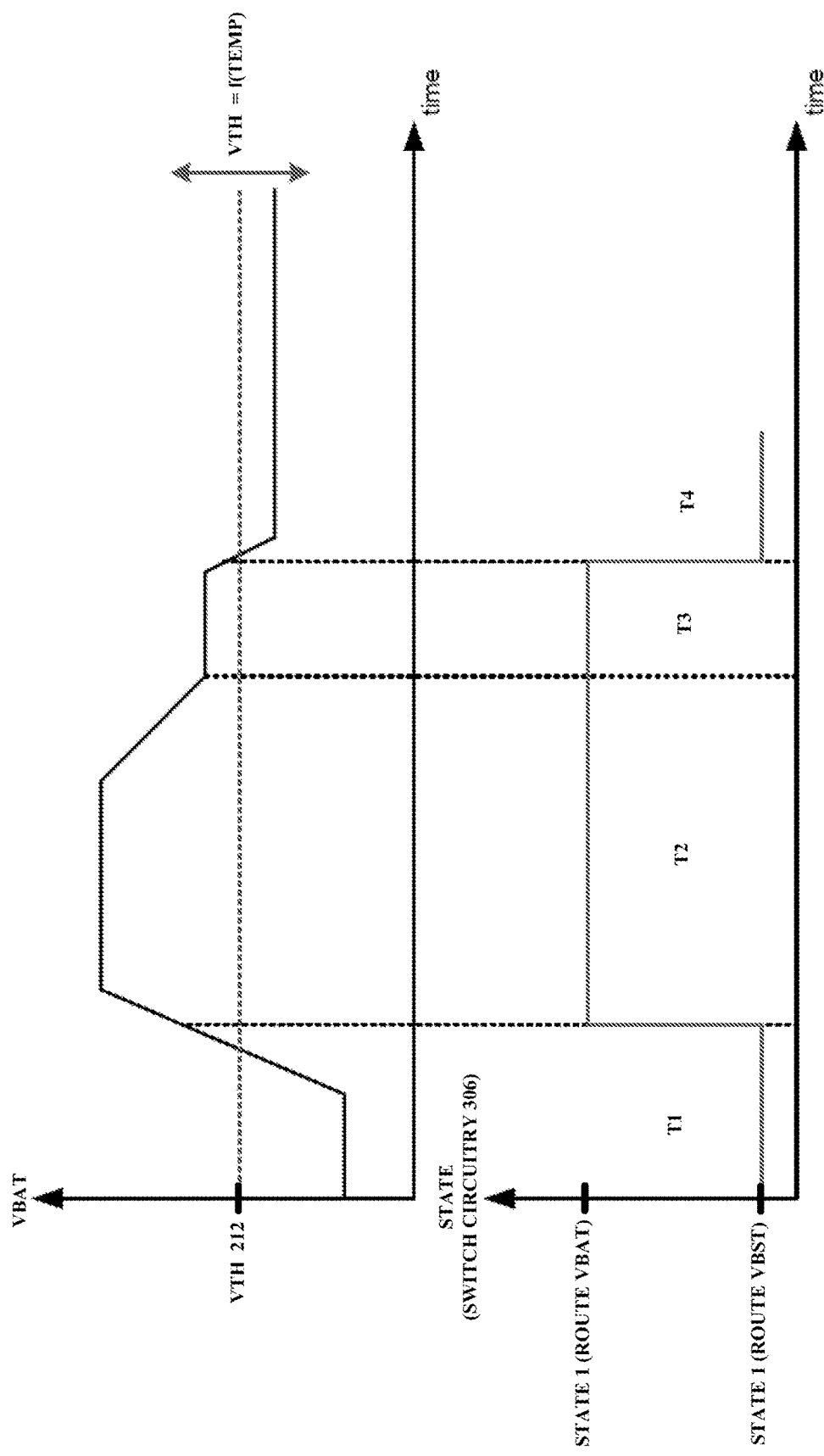
FIG. 9 shows a plot of position of switch circuitry of FIG. 4 versus time in accordance with the present disclosure.

In some examples, SVSC 102 is further configured to monitor (806) VBAT in order to dynamically switch between VBAT and VBST to power LSDC 114. The phrase "dynamically switch" as used in the context of the present disclosure is intended to indicate that method 800 is implemented on an on-going basis such as continuously, periodically or at least intermittently in time. The dynamic switching may be advantageous because conditions or variables such as motor (vehicle) mode or state, temperature, electrical load, mechanical load as well as other conditions or variables are in general dynamic and not fixed or static or time. Thus, SVSC 102 may be further configured to determine (808) whether VBAT as monitored reaches the value for VTH 212 as calculated within any particular time duration or period (dT). If so (Y:808), SVSC 102 may be configured to switch (810) between VBAT and VBST to power LSDC 114 at a time that VBAT as monitored reaches the value for VTH 212, otherwise (N:808) SVSC 102 may re-acquire (802) a reading of one or more system parameters 126 at expiration of the particular time duration or period (dT). By doing so, with SVSC 102 to dynamically switch between VBAT and VBST to power LSDC 114, the inefficiency and IC package-size-related issues associated with the typical implementation as mentioned above are simultaneously overcome. FIG. 9 is further illustrative of the features or aspects of the present disclosure.

FIG. 9 shows a plot 900 of state of switch circuitry 306 of FIG. 4 versus time in accordance with the present disclosure. With additional reference to FIGS. 2-4, SVSC 102 is configured to control state (i.e., ON/OFF, OPENED/CLOSED, 1/0, etc.) of switch circuitry 306 during time segment T1 such that VBST is routed or delivered to LSDC 114. Further, SVSC 102 is configured to detect VBAT exceed VTH 212, to hold for a predefined or programmable period of time, to insure that VBAT is sufficiently stable, and then to control state of switch circuitry 306 at onset of time segment T2 such that VBAT is routed or delivered to LSDC 114. During time segment T2, VBAT is of sufficient magnitude and stable and thus is used to directly power LSDC 114.

SVSC 102 is further configured to control state of switch circuitry 306 during time segment T3 such that VBAT is routed or delivered to LSDC 114. During time segment T3, VBAT is in magnitude less than that as compared to time segment T2, but VBAT is of sufficient magnitude and stable and thus is used to power LSDC 114. In this example, SVSC 102 does not take action in response to the relatively slow transient event, the amount of time to decrease in magnitude of VBAT from a maximum during time segment T2 to that at onset of time segment T2, and relies on absolute voltage level of VBAT which is sufficiently high.

SVSC 102 is further configured to control state of switch circuitry 306 during time segment T4 such that VBST is routed or delivered to LSDC 114. More specifically, SVSC 102 is configured to detect a rapid transient event, the amount of time to decrease in magnitude of VBAT from a maximum during time segment T3 to that at onset of time segment T4, and then to control state of switch circuitry 306 at onset of time segment T4 such that VBST is routed or delivered to LSDC 114. In this example, SVSC 102 is predictive in that SVSC 102 immediately configures switch circuitry 306 to deliver VBST to LSDC 114 since the magnitude of VBAT during time segment T3 is relatively close in magnitude to VTH 212, and the relatively rapid transient event is indicative that VBAT is swiftly drifting in magnitude towards a value less than VTH 212. In practice, to control state of switch circuitry 306 in a manner as discussed throughout, SVSC 102 may be realized in many different ways in terms of circuit topology, which may be implementation-specific, and may evolve as technology evolves.

Figure 10:
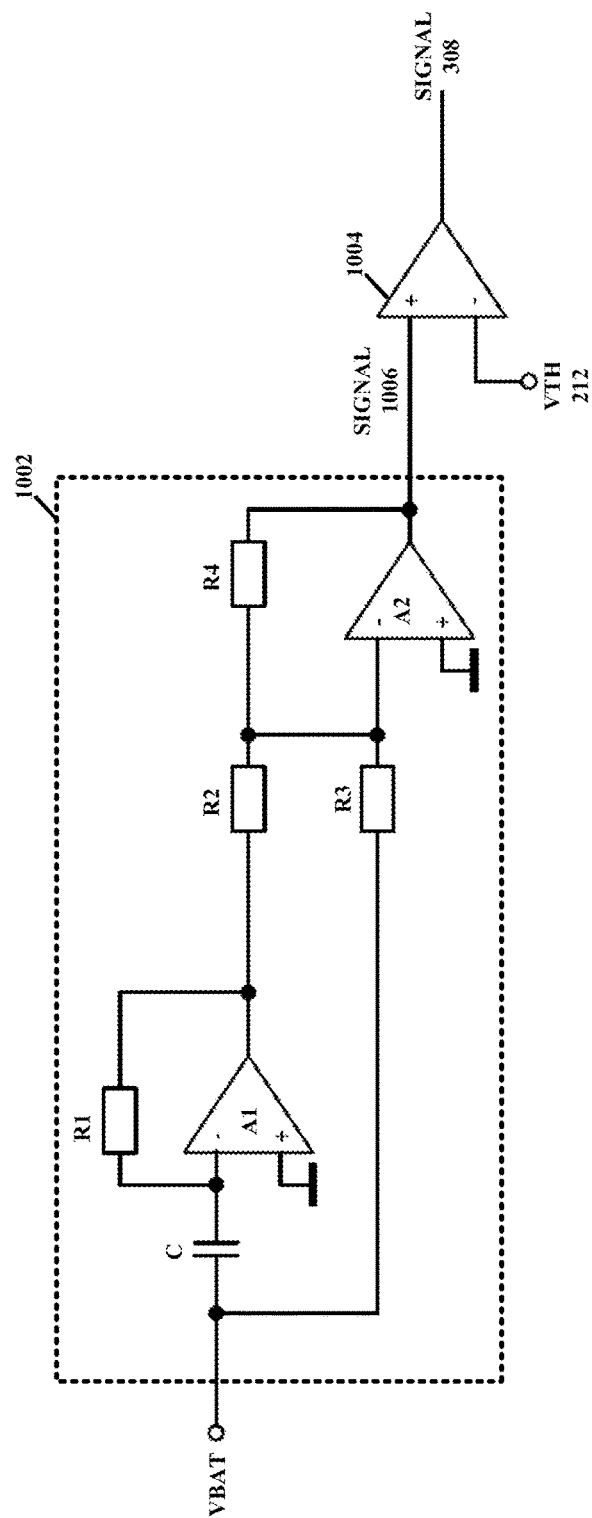
FIG. 10 shows a circuit diagram of control circuitry of FIGS. 3-4, in a first example implementation.
Figure 11:
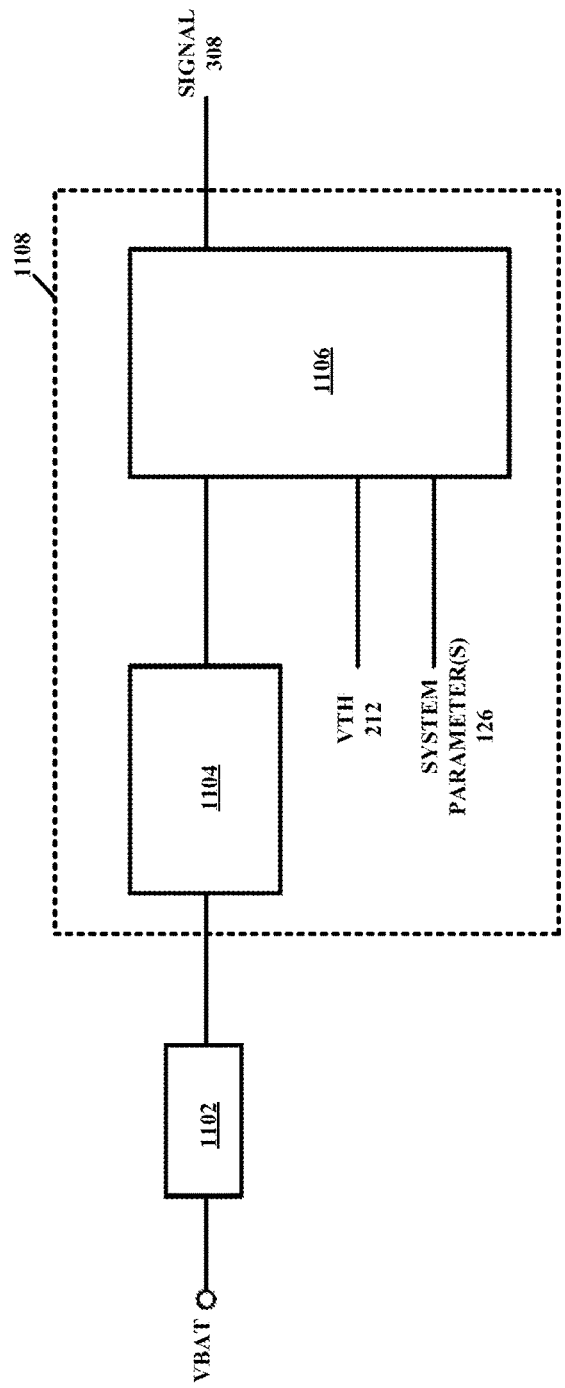
FIG. 11 shows a circuit diagram of control circuitry of FIGS. 3-4, in a second example implementation.
Figure 12:
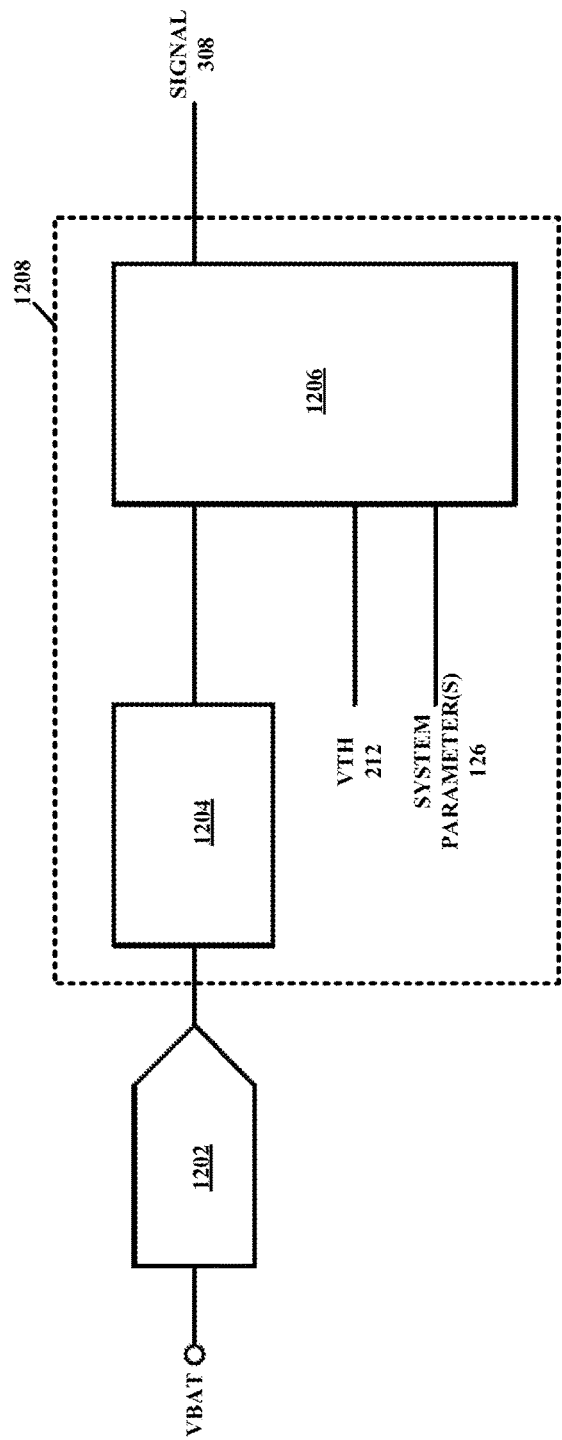
FIG. 12 shows a circuit diagram of control circuitry of FIGS. 3-4, in a third example implementation.

For example, FIGS. 10-12 each illustrate an implementation-specific circuit topology for at least a portion of SVSC 102. In particular, FIG. 10 shows a circuit diagram 1000 of control circuitry 305 of FIGS. 3-4, in a first example implementation. FIG. 11 shows a circuit diagram 1100 of control circuitry 305 of FIGS. 3-4, in a second example implementation. FIG. 12 shows a circuit diagram 1200 of control circuitry 305 of FIGS. 3-4, in a third example implementation.

In the example of FIG. 10, control circuitry 305 corresponds to analog circuitry and comprises summation circuitry 1002 and comparator circuitry 1004, whereby summation circuitry 1002 is configured to generate a sum signal 1006 from a weighted version of VBAT and a weighted derivative version VBAT, and comparator circuitry 1004 is configured to output signal 308 based upon a comparison between sum signal 1006 and VTH 212. In some examples, absolute voltage level, change rate of voltage and available headroom correspond to adjustable parameters, and the parameters may be adjusted by selecting proper dimensions for the passive components shown in FIG. 10.

In the example of FIG. 11, control circuitry 305 corresponds to digital circuitry and comprises successive approximation analog-digital converter (SAR ADC) circuitry 1102, digital filter circuitry 1104 and digital comparator circuitry 1106 (collectively, digital signal processing or DSP switch control circuitry 1108), whereby SAR ADC circuitry 1102 is configured to digitize the instantaneous magnitude of VBAT repeatedly (e.g., periodically or at least intermittently) as voltage samples. DSP switch control circuitry 1108 is configured to process the voltage samples and to subsequently output signal 308 based on information of or represented by the voltage samples, whereby VTH 212 may be modulated by system parameter(s) 126, such as temperature or external information such as cranking information, in a manner as discussed throughout and in connection with FIG. 3.

In the example of FIG. 12, control circuitry 305 corresponds to digital circuitry and comprises delta modulator circuitry 1202, and digital filter circuitry 1204 and digital comparator circuitry 1206 (collectively, digital signal processing or DSP switch control circuitry 1208), whereby control circuitry 305 in this example is configured to implement signal processing on bit-stream basis with digital filter circuitry 1204 (e.g., realized as finite impulse response filters and/or infinite impulse response filters) and subsequently the digital information is be provided to digital comparator circuitry 1206 that is configured to function as a digital bit-stream comparator. In the example of FIG. 12, as well as in each ono of the examples discussed in connection with the figures, VTH 212 may be modulated by system parameter(s) 126 selected from one or more of instantaneous magnitude of battery voltage, battery voltage development over time (history of battery voltage and battery voltage prediction e.g. using the derivative of the battery voltage), environmental conditions, such as device temperature and ambient temperature, and other operation states and conditions which are known or otherwise detectable. In this manner, SVSC 102 is configured to dynamically switch between VBAT and VBST to power LSDC 114 based on an on-going evaluation of one or more system parameters 126.

Additionally, the following numbered examples demonstrate one or more aspects of the disclosure.

Example 1

A circuit comprising: supply voltage selection circuitry configured to provide a supply voltage to gate driver circuitry; wherein the supply voltage selection circuitry is further configured to select between a first supply voltage and a second supply voltage that is greater in magnitude than the first supply voltage; and wherein the supply voltage selection circuitry is further configured to deliver the first supply voltage to the gate driver circuitry on condition that the first supply voltage is in magnitude greater than or equal to a threshold voltage value and to deliver the second supply voltage to the gate driver circuitry on condition that the first supply voltage is in magnitude less than the threshold voltage value.

Example 2

The circuit of example 1, further comprising the gate driver circuitry, wherein the gate driver circuitry is coupled to the supply voltage selection circuitry and comprises low-side half-bridge gate driver circuitry, and the circuit further comprising: voltage regulator circuitry that is coupled to the supply voltage selection circuitry and the low-side half-bridge gate driver circuitry, and that is configured to receive as input the one of the first supply voltage and the second supply voltage, and, based on the one of the first supply voltage and the second supply voltage, output a supply voltage to power the low-side half-bridge gate driver circuitry.

Example 3

The circuit of any one of examples 1-2, wherein the voltage regulator circuitry comprises a low-dropout voltage regulator.

Example 4

The circuit of any one of examples 1-3, further comprising the gate driver circuitry, wherein the gate driver circuitry is coupled to the supply voltage selection circuitry and comprises low-side half-bridge gate driver circuitry and high-side half-bridge gate driver circuitry, and the circuit further comprising: first voltage regulator circuitry that is coupled to the supply voltage selection circuitry and the low-side half-bridge gate driver circuitry, and that is configured to receive as input the one of the first supply voltage and the second supply voltage, and, based on the one of the first supply voltage and the second supply voltage, output a supply voltage to power the low-side half-bridge gate driver circuitry; and second voltage regulator circuitry that is coupled to the high-side half-bridge gate driver circuitry, and that is configured to receive as input the second supply voltage, and, based on the second supply voltage, output a supply voltage to power the high-side half-bridge gate driver circuitry.

Example 5

The circuit of any one of examples 1-4, further comprising the gate driver circuitry, wherein the gate driver circuitry is coupled to the supply voltage selection circuitry and comprises low-side half-bridge gate driver circuitry and high-side half-bridge gate driver circuitry, and the circuit further comprising: first voltage regulator circuitry that is coupled to the supply voltage selection circuitry and the low-side half-bridge gate driver circuitry, and that is configured to receive as input the one of the first supply voltage and the second supply voltage, and, based on the one of the first supply voltage and the second supply voltage, output a supply voltage to power the low-side half-bridge gate driver circuitry; low-side switch circuitry, of a half-bridge, that is coupled to an output of the low-side half-bridge gate driver circuitry; second voltage regulator circuitry that is coupled to the high-side half-bridge gate driver circuitry, and that is configured to receive as input the second supply voltage, and, based on the second supply voltage, output a supply voltage to power the high-side half-bridge gate driver circuitry; and high-side switch circuitry, of the half-bridge, that is coupled to an output of the high-side half-bridge gate driver circuitry.

Example 6

The circuit of any one of examples 1-5, wherein the supply voltage selection circuitry is configured to be coupled to a battery, wherein the first supply voltage is a supply voltage provided by the battery.

Example 7

The circuit of any one of examples 1-6, wherein the supply voltage selection circuitry comprises switch circuitry, and wherein the switch circuitry in a first state is configured to deliver the first supply voltage to the gate driver circuitry and in a second state is configured to deliver the second supply voltage to the gate driver circuitry.

Example 8

The circuit of any one of examples 1-7, wherein the supply voltage selection circuitry comprises switch circuitry, and wherein the switch circuitry in a first state is configured to deliver the first supply voltage to the gate driver circuitry and in a second state is configured to deliver the second supply voltage to the gate driver circuitry.

Example 9

The circuit of any one of examples 1-8, wherein the boost converter circuitry comprises processor circuitry, analog-digital converter circuitry and control circuitry arranged in a loop topology and configured to regulate the second supply voltage to a magnitude within specification tolerance, and wherein the control circuitry comprises a switch, a first diode and a second diode, wherein the switch is configured to energize an external boost inductor, the first diode is configured for reverse polarity protection and the second diode is configured for signal rectification.

Example 10

The circuit of any one of examples 1-9, wherein the boost converter circuitry comprises processor circuitry, analog-digital converter circuitry, digital-analog converter circuitry and control circuitry, wherein the control circuitry comprises a switch, a diode and a comparator, and wherein the switch is configured to energize an external boost inductor, the diode is configured for signal rectification, a voltage regulation loop is defined between the processor circuitry, the analog-digital converter circuitry and the control circuitry to regulate the second supply voltage to a magnitude within specification tolerance, and a current regulation loop is defined to gain current information via peak current techniques using the digital-analog converter circuitry to generate a set-point and the comparator to monitor current flowing in the external boost inductor.

Example 11

The circuit of any one of examples 1-10, wherein the boost converter circuitry is configured to be coupled to a boost inductor and capacitor to generate the second supply voltage from the first supply voltage.

Example 12

A method comprising: monitoring a battery supply voltage; based on a magnitude of the battery supply voltage, selecting one of the battery supply voltage and a boost supply voltage that is generated from the battery supply voltage as supply voltage for gate driver circuitry; and delivering the battery supply voltage to the gate driver circuitry on condition that the battery supply voltage is in magnitude greater than or equal to a threshold voltage value or the boost supply voltage to the gate driver circuitry on condition that the battery supply voltage is in magnitude less than the threshold voltage value.

Example 13

The method of any one of examples 12, further comprising: generating a regulated supply voltage from the one of the battery supply voltage and the boost supply voltage; and routing the regulated supply voltage to the gate driver circuitry to power the gate driver circuitry.

Example 14

The method of any one of examples 12-13, further comprising: monitoring a parameter other than the battery supply voltage; and based on the magnitude of the battery supply voltage and on the parameter other than the battery supply voltage, selecting one of the battery supply voltage and the boost supply voltage as supply voltage for the gate driver circuitry.

Example 15

The method of any one of examples 12-14, wherein the parameter other than the battery supply voltage is selected from one of: a voltage level of a node internal or external a half-bridge driver integrated circuit (IC); a temperature level of a component internal or external the half-bridge driver IC; a mode or status of the component internal or external the half-bridge driver IC; and a derivative, integral or statistical value derived from a signal at the node internal or external the half-bridge driver IC.

Example 16

The method of any one of examples 12-15, further comprising controlling the state of switch circuitry to deliver the one of the battery supply voltage and the boost supply voltage as supply voltage for the gate driver circuitry.

Example 17

The method of any one of examples 12-16, further comprising periodically or intermittently calculating the threshold voltage value.

Example 18

A half-bridge driver integrated circuit (IC) comprising: low-side half-bridge gate driver circuitry; and processor circuitry configured to: monitor a battery supply voltage; and based on a magnitude of the battery supply voltage, select one of the battery supply voltage and a boost supply voltage that is generated from the battery supply voltage as supply voltage for the low-side half-bridge gate driver circuitry.

Example 19

The half-bridge driver (IC) of example 18, wherein the processor circuitry is configured to calculate a threshold voltage value, and to control switch circuitry to deliver the battery supply voltage to the low-side half-bridge gate driver on condition that the magnitude of the battery supply voltage is greater than or equal to the threshold voltage value or the boost supply voltage to the low-side half-bridge gate driver on condition that the magnitude of the battery supply voltage is less than or equal to the threshold voltage value.

Example 20

The half-bridge driver (IC) of any one of examples 18-19, wherein the processor circuitry is configured to monitor a temperature of the half-bridge driver IC, and to calculate the threshold voltage value based on the temperature of the half-bridge driver IC.

Various examples of the disclosure have been described. Any combination of the described systems, operations, or functions is contemplated. These and other examples are within the scope of the following claims.

What is claimed is:

1. A circuit comprising:
    gate driver circuitry comprising low-side half-bridge gate driver circuitry and high-side half-bridge gate driver circuitry;
    low-side switch circuitry, of a half-bridge, that is coupled to an output of the low-side half-bridge gate driver circuitry;
    high-side switch circuitry, of the half-bridge, that is coupled to an output of the high-side half-bridge gate driver circuitry;
    supply voltage selection circuitry configured to provide a supply voltage to the gate driver circuitry,
    wherein the gate driver circuitry is coupled to the supply voltage selection circuitry,
    wherein the supply voltage selection circuitry is further configured to select between a first supply voltage and a second supply voltage that is greater in magnitude than the first supply voltage, and
    wherein the supply voltage selection circuitry is further configured to deliver the first supply voltage to the gate driver circuitry on condition that the first supply voltage is in magnitude greater than or equal to a threshold voltage value and to deliver the second supply voltage to the gate driver circuitry on condition that the first supply voltage is in magnitude less than the threshold voltage value;
    first voltage regulator circuitry that is coupled to the supply voltage selection circuitry and the low-side half-bridge gate driver circuitry, and that is configured to receive as input the one of the first supply voltage and the second supply voltage, and, based on the one of the first supply voltage and the second supply voltage, output a supply voltage to power the low-side half-bridge gate driver circuitry; and
    second voltage regulator circuitry that is coupled to the high-side half-bridge gate driver circuitry, and that is configured to receive as input the second supply voltage, and, based on the second supply voltage, output a supply voltage to power the high-side half-bridge gate driver circuitry.

2. The circuit of claim 1, wherein the first voltage regulator circuitry comprises a low-dropout voltage regulator.

3. The circuit of claim 1, wherein the supply voltage selection circuitry is configured to be coupled to a battery, wherein the first supply voltage is a supply voltage provided by the battery.

4. The circuit of claim 1, wherein the supply voltage selection circuitry comprises switch circuitry, and wherein the switch circuitry in a first state is configured to deliver the first supply voltage to the gate driver circuitry and in a second state is configured to deliver the second supply voltage to the gate driver circuitry.

5. The circuit of claim 1, further comprising boost converter circuitry, wherein the boost converter circuitry is configured to receive the first supply voltage as input and output the second supply voltage based on the first supply voltage.

6. The circuit of claim 5,
wherein the boost converter circuitry comprises processor circuitry, analog-digital converter circuitry and control circuitry arranged in a loop topology and configured to regulate the second supply voltage to a magnitude within specification tolerance, and
wherein the control circuitry comprises a switch, a first diode and a second diode, wherein the switch is configured to energize an external boost inductor, the first diode is configured for reverse polarity protection and the second diode is configured for signal rectification.

7. The circuit of claim 5,
wherein the boost converter circuitry comprises processor circuitry, analog-digital converter circuitry, digital-analog converter circuitry and control circuitry,
wherein the control circuitry comprises a switch, a diode and a comparator, and
wherein the switch is configured to energize an external boost inductor, the diode is configured for signal rectification, a voltage regulation loop is defined between the processor circuitry, the analog-digital converter circuitry and the control circuitry to regulate the second supply voltage to a magnitude within specification tolerance, and a current regulation loop is defined to gain current information via peak current techniques using the digital-analog converter circuitry to generate a set-point and the comparator to monitor current flowing in the external boost inductor.

8. The circuit of claim 5, wherein the boost converter circuitry is configured to be coupled to a boost inductor and capacitor to generate the second supply voltage from the first supply voltage.

9. A circuit comprising:
boost converter circuitry configured to receive a first supply voltage as input and output, based on the first supply voltage, a second supply voltage that is greater in magnitude than the first supply voltage; and
supply voltage selection circuitry configured to provide a supply voltage to gate driver circuitry,
wherein the boost converter circuitry comprises processor circuitry, analog-digital converter circuitry, digital-analog converter circuitry and control circuitry,
wherein the control circuitry comprises a switch, a diode and a comparator,
wherein the switch is configured to energize an external boost inductor, the diode is configured for signal rectification, a voltage regulation loop is defined between the processor circuitry, the analog-digital converter circuitry and the control circuitry to regulate the second supply voltage to a magnitude within specification tolerance, and a current regulation loop is defined to gain current information via peak current techniques using the digital-analog converter circuitry to generate a set-point and the comparator to monitor current flowing in the external boost inductor,
wherein the supply voltage selection circuitry is further configured to select between the first supply voltage and the second supply voltage that is greater in magnitude than the first supply voltage, and
wherein the supply voltage selection circuitry is further configured to deliver the first supply voltage to the gate driver circuitry on condition that the first supply voltage is in magnitude greater than or equal to a threshold voltage value and to deliver the second supply voltage to the gate driver circuitry on condition that the first supply voltage is in magnitude less than the threshold voltage value.

* * * * *